PHASE LOCKED TRIGGER GENERATOR

Filed March 1, 1960

INVENTOR.
GEORGE F. MORRIS
BY
T. L. Styner
ATTORNEY

United States Patent Office 3,051,905

Patented Aug. 28, 1962

3,051,905

PHASE LOCKED TRIGGER GENERATOR

George F. Morris, Rochester, N.Y., assignor to General Dynamics Corporation, Rochester, N.Y., a corporation of Delaware Filed Mar. 1, 1960, Ser. No. 12,147
5 Claims. (Cl. 328—13)

The present invention relates generally to a circuit for generating a trigger pulse and is more particularly concerned with a circuit for developing from an input having wide variations in amplitude an output having constant amplitude and phase which output is phase locked to the input signal.

In a number of electronic circuits it is desirable to develop a trigger pulse of substantially constant amplitude and phase from an input signal which varies widely in amplitude. Any variations in the input signal amplitude appear in the pulse generated and adversely affect the succeeding circuits. While circuits, such as limiters, have been proposed heretofore for clipping the upper and lower extremes of the input signal above and below predetermined levels, this solution is not completely satisfactory since the clipping usually introduces phase shifts so that the clipped signal is no longer phase locked to the input signal. It would, of course, be desirable to provide a circuit for developing the trigger pulse without introducing such phase shifts, and the satisfaction of this desire, therefore, constitutes one of the primary objects of the present invention.

A further object of the invention is to provide a circuit for developing an output signal having constant amplitude and phase despite wide variations in the amplitude of the input signal to the circuit.

The invention has for another object the provision of a circuit for developing a trigger pulse which is very accurately phase locked to the input signal even though the latter signal may be subject to large variations in amplitude.

Another object of the invention is to provide a circuit capable of achieving all of the beneficial results described above without requiring the use of very high gain amplifiers which have a tendency to introduce distortion into the output signal.

In accordance with the present invention, the foregoing and other objects are realized by the provision of a circuit including an input amplifier excited by a sine wave input signal subject to relatively large amplitude variations. A pair of parallel connected, oppositely poled diodes in the output of the amplifier clip the upper and lower extremes of the sine wave signal but, as a result of any non-symmetry of the diodes, the clipping may be accompanied by a phase shift. The clipped signal is passed through a band pass filter centered on the frequency of the input signal and sufficiently selective to provide very large attenuation to all the harmonics of the input. Since all distortions of the input wave including that caused by clipping via the diodes are composed of harmonics of the fundamental input wave, the output of the filter is an undistorted wave phase locked to the input signal regardless of any variations in the amplitude of the input wave. This output has a constant amplitude since the peak to peak amplitude of the clipped signal from the diodes is constant. This constant amplitude, phase locked sine wave signal is supplied through several stages of combined amplification and clipping to develop a square wave which is differentiated in conventional manner to develop a trigger pulse. The latter pulse is, of course, of constant amplitude and bears a fixed phase relationship to the input signal despite the latter's amplitude variations.

The invention both as to its organization and manner of operation together with further objects and advantages will best be understood by reference to the following description taken in conjunction with the accompanying drawing wherein.

Figure 1:
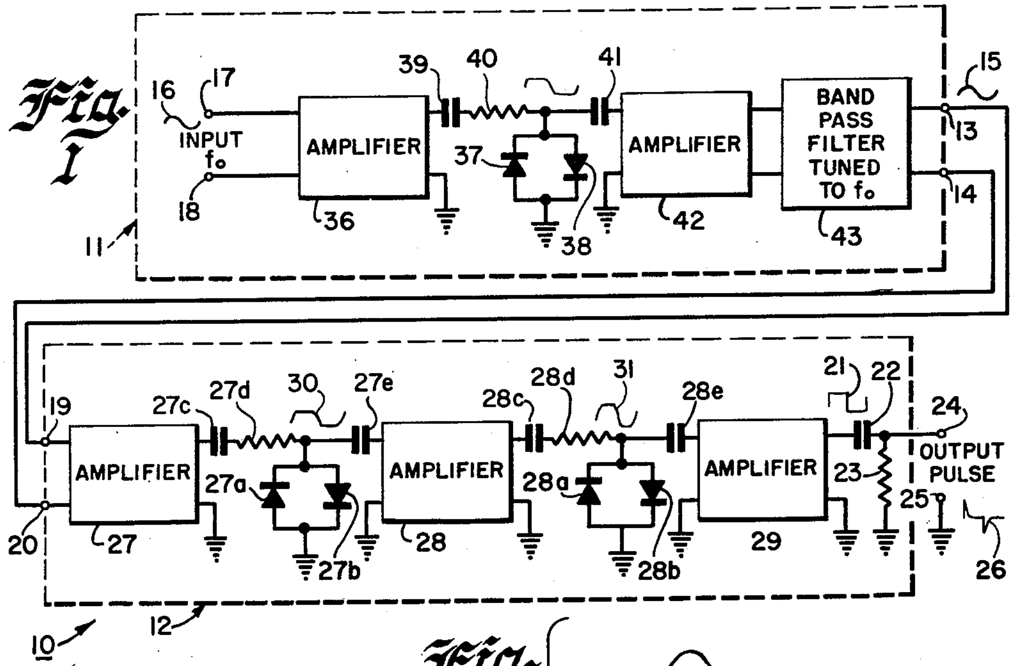
FIG. 1 is a block diagram depicting a circuit characterized by the features of the present invention and includes a number of typical waveforms present at various points in the circuit.

Referring now to the drawing and first to FIG. 1, an illustrative embodiment of the present invention is there identified generally by the reference numeral 10 and may be said to include two subcircuits 11 and 12 respectively enclosed by the broken lines. The circuit 10 may be referred to as a sine wave developing circuit since its function is to produce across its output terminals 13 and 14 a constant amplitude sine wave signal indicated at 15 in response to a sine wave input signal 16 applied across the circuit input terminals 17 and 18. The input signal, as was indicated above, may be subject to variations in amplitude between very wide extremes but the subcircuit 11 serves to develop an output signal 15 which, despite the variations in the input signal, is phase locked to the input signal and is of constant amplitude.

The subcircuit 12 may be referred to as a pulse generator circuit since it responds to the sine wave signal 15 applied across its input terminals 19 and 20 by developing a square wave signal indicated at 21 which is passed through a conventional differentiator circuit consisting of capacitor 22 and resistor 23 in order to produce at the output terminals 24 and 25 a trigger pulse as indicated by the wave 26. To facilitate an understanding of the function and advantages of the subcircuit 11, the operation of the pulse generating circuit will first be considered assuming that the input signal 16, subject to wide variations in amplitude, is applied directly across the input terminals 19 and 20, thus bypassing altogether the subcircuit 11. Under these conditions, the incoming signal is passed through several stages of amplification 27, 28 and 29 each of which is a conventional single stage vacuum tube or transistor amplifier providing gain and isolation. Although three such stages are illustrated, actually any desired number may be employed as required to develop a square wave signal of the required sharpness in its leading and trailing edges. Each amplifier has in its output circuit a pair of diodes, for example, of the silicon junction type IN659, connected in parallel but oppositely poled. The diodes at the output of the amplifier 27 are numbered **27*a* and 27*b* while those at the output of the amplifier 28 are numbered 28*a* and 28*b*. The characteristics of these diodes are such that for voltages from zero to a predetermined breakdown level, for example, about 0.5 volt, in the forward direction the diodes offer a very high resistance while for voltages exceeding the breakdown level, the resistance is very low. Each pair of parallel but reverse connected diodes thus clips a sine wave whose upper and lower peaks exceed the breakdown level to form a trapezoidal wave which has a peak to peak voltage equal to twice the breakdown level or about 1 volt in the diodes described above. Capacitors 27*c* and 28*c* block any D.C. currents at the output of the amplifiers 27 and 28, respectively. Resistors 27*d* and 28*d* are large in comparison with the forward conducting resistance of the diodes thus permitting the clipping action described above. Capacitors 27*e* and 28*e* couple the trapezoidal wave produced by the diode pairs to the input circuits of the amplifiers 28 and 29, respectively. Thus, it will be evident that the input sine wave applied across terminals 19 and 20 is amplified in the stage 27, the resulting signal is clipped by diodes 27***a* and 27*b* to form a trapezoidal wave 30 which is amplified in the stage 28. The output of the stage 28 is again clipped by diodes 28*a* and 28*b* to produce a substantially square wave indicated at 31 which is amplified in the stage 29 and is then differentiated in conventional manner to form the pulsed output 26.

Figure 2:
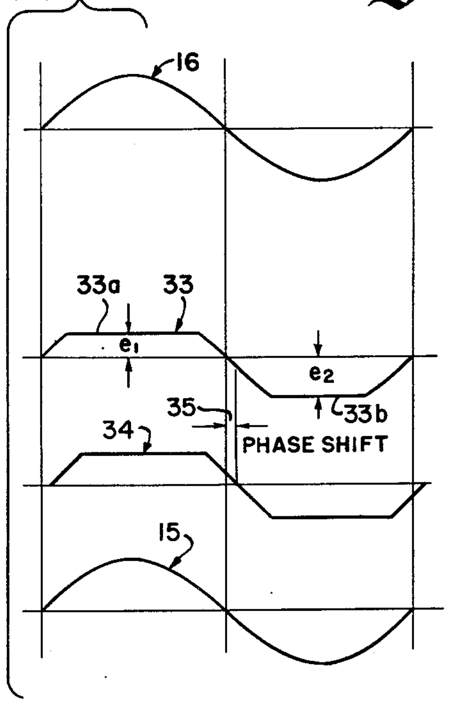
FIG. 2 illustrates a number of waveforms present at different points in the circuit shown in FIG. 1 with an input signal of relatively small amplitude.
Figure 3:
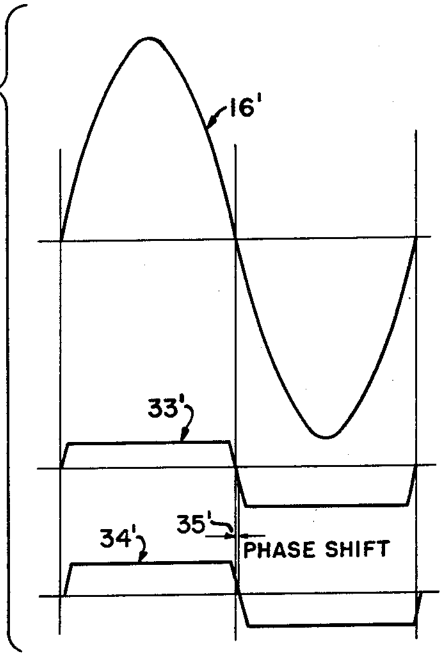
FIG. 3 is similar to FIG. 2 but shows the waveforms present when the circuit is excited by an input signal of relatively large amplitude.

If the diode pairs 27*a*—27*b* or 28*a*—28*b* are non-symmetrical, that is, if their breakdown levels are not exactly equal, the clipped trapezoidal wave will also be non-symmetrical. This condition is illustrated in FIG. 2 where the input sine wave is indicated at 16, while the output from one pair of clipping diodes having slightly different breakdown levels is indicated at 33. This condition may exist either at the diodes 27*a* and 27*b* or at the diodes 28*a* and 28*b* or at both pairs of diodes but for purposes of explanation let it be assumed that the non-symmetry of the trapezoidal wave 33 arises from unequal breakdown levels of the diodes 27*a* and 27*b*. It will be observed that the half cycle 33*a* of the wave 33 is clipped at a level $e_1$ which is somewhat less than the clipping level $e_2$ for the half cycle 33*b*. When the non-symmetrical wave 33 is passed through the succeeding coupling condenser 27*e* and the amplifying stage 28, the wave is centered so that the two half cycles are equally distributed above and below the zero axis. The resulting wave is identified in FIG. 2 by the reference numeral 34. The centering of the wave introduces a phase shift indicated at 35 the magnitude of which is inversely proportional to the amplitude of the sine wave input signal. Thus, for small amplitude input signals the phase shift is relatively large as is indicated by the series of waveforms in FIG. 2, while with large amplitude input signals the phase shift is much smaller as is indicated by the series of waveforms depicted in FIG. 3. In the latter group of waveforms, the input signal 16' is much larger in amplitude than the corresponding input signal 16 shown in FIG. 2. This large input signal 16' is clipped by the diodes to the same peak to peak value as before with the non-symmetry again being introduced. The resulting non-symmetrical trapezoidal wave 33' is again centered as indicated at 34' but since the leading and trailing edges of the trapezoidal wave have a steeper slope than the corresponding wave 33, the phase shift 35' introduced by the centering is much less than that introduced into the wave resulting from the low amplitude input signal. Therefore, to insure only small phase shifts between the input to the diodes amplification in the stage 27 should be large. However, if the gain of the stage 27 is made sufficiently high to provide a large enough signal at the diodes 27*a* and 27*b* to prevent large phase shifts when the input signal to terminals 19 and 20 is at its minimum value, then the amplifier 27 is over-driven when the input signal is at its maximum value. Such over-drive causes serious non-symmetrical distortion and an intolerable phase shift of the output pulse. If, on the other hand, the amplifier gain is relatively low, the phase of the output pulse will shift with amplitude variations in the manner indicated above.

This problem is solved in accordance with the present invention by the use of the sine wave forming subcircuit 11 which includes an amplifier 36 having in its output circuit a pair of clipping diodes 37 and 38 like the diode pairs previously described. A blocking condenser 39, a resistor 40 and a coupling capacitor 41 like those discussed above are again employed. The input signal 16 of frequency $f_0$, which is applied to the amplifier 36, is, of course, characterized by the wide excursions in amplitude described above. The gain of the amplifier 36 may be relatively low but is sufficient to insure clipping of both peaks of the amplified sine wave by the diodes 37 and 38. Greater gain is not harmful but is unnecessary. Here again, the diodes 37 and 38 clip the sine wave peaks to form a trapezoidal shaped wave, which may again be non-symmetrical due to the unequal breakdown levels of the diodes. This wave is passed through an amplifier stage 42 and the resulting amplified signal is applied to a band pass filter 43 center tuned to a frequency $f_0$ corresponding to the frequency of the input sine wave. The filter 43 may be of any conventional type provided only that it is sufficiently selective to provide very large attenuation to all of the harmonics of the input signal. While the input to the filter is made up of the fundamental input sine wave together with harmonics thereof introduced by the clipping and perhaps by over-drive of the amplifier 36, the output wave from the filter is an undistorted sine wave 15 having a frequency $f_0$. Any harmonics introduced by non-symmetrical clipping and/or by amplifier over-drive are therefore eliminated. Moreover, while the non-symmetrical clipping or limiting of the sine wave from the amplifier 36 produces a phase shift in the zero cross-over of the resulting trapezoidal wave, this clipping action does not introduce a phase shift in the fundamental component of the trapezoidal waveform. This can be demonstrated mathematically but since the procedure is long and detailed it will be omitted from the present description. In any event, when the fundamental component is separated from the harmonics by the filter 43, the phase shift caused by the non-symmetrical limiting is eliminated and the resulting output sine wave 15 is in fixed phase relationship with the input signal 16 as is indicated by the waveforms in FIG. 2. Since the amplitude of the wave fed to the filter 43 is held to a constant peak to peak amplitude by the diodes 37 and 38 the output wave has a substantially constant amplitude. Thus, the subcircuit 11 develops a sine wave output which, despite any variations in the amplitude of the input wave, is of constant amplitude and bears a fixed phase relationship to the input.

When the output signal 15 is used to drive the pulse generating subcircuit 12, the pulsed output 26 is the desired trigger pulse phase locked to the input signal 16. More specifically, since the drive to the subcircuit 12 is of constant amplitude, it will be apparent that the output pulse is in fixed phase relationship with the signal 15 which, in turn is phase locked to the input signal 16.

While a particular embodiment of the invention has been shown, it will be understood, of course, that the invention is not limited thereto since many modifications may be made and it is, therefore, contemplated by the appended claims to cover any such modifications as fall within the true spirit and scope of the invention.

What is claimed as new and desired to be secured by Letters Patent of the United States is:

1. In an apparatus for developing a trigger pulse in response to an alternating current input signal containing a sinusoidal component subject to variations in amplitude; a wave forming circuit excited by the input signal for producing an output sinusoidal signal phase locked to and equal in frequency with the sinusoidal component of the input signal but having a nearly constant amplitude, said circuit comprising an amplifier stage for amplifying the input signal and having in its output a pair of parallel connected, oppositely poled rectifiers for clipping both peaks of the amplified input signal above and below predetermined levels, and a band pass filter tuned to the frequency of the input signal and sufficiently selective to reject all of the harmonics thereof for receiving the clipped signal developed by the rectifiers and developing therefrom the output signal from said circuit, said output signal bearing a fixed phase relationship to the input signal despite amplitude variations in the latter and despite any non-symmetrical clipping by said rectifiers; and a pulse generating network excited by said output signal and including a combined amplifier and clipper for developing from said output signal a somewhat square shaped wave, said network further including means for differentiating said wave to develop an output pulse accurately phase locked to the input signal regardless of amplitude variations of said input signal.

2. The apparatus defined by claim 1 wherein the amplifier stage has a gain of such value that even minimum amplitude input signals cause an alternating current signal to be applied across said rectifiers of sufficient peak values to cause conduction of one of the rectifiers during a portion of one half cycle and to cause conduction of the other rectifier during a portion of the other half cycle.

3. In an apparatus for developing a trigger pulse in response to a sinusoidal alternating current input signal subject to variations in amplitude; a wave forming circuit excited by the input signal for producing an output sinusoidal signal phase locked to and equal in frequency with the input signal but having a nearly constant amplitude, said circuit comprising an amplifier stage for amplifying the input signal and having in its output a pair of parallel connected, oppositely poled rectifiers for clipping both peaks of the amplified input signal above and below predetermined levels, and a band pass filter tuned to the frequency of the input signal and sufficiently selective to reject all of the harmonics thereof for receiving the clipped signal developed by the rectifiers and developing therefrom the output signal from said circuit, said output signal bearing a fixed phase relationship to the input sinusoidal signal despite amplitude variations in the latter and despite any non-symmetrical clipping by said rectifiers; and a pulse generating network excited by said output signal for developing therefrom an output pulse accurately phase locked to the input signal regardless of amplitude variations of said input signal.

4. The apparatus defined by claim 3 wherein the amplifier stage has a gain of such value that even minimum amplitude input signals cause an alternating current signal to be applied across said rectifiers of sufficient peak values to cause conduction of one of the rectifiers during a portion of one half cycle and to cause conduction of the other rectifier during a portion of the other half cycle.

5. A wave forming circuit excited by an alternating current input signal for producing an output signal phase locked to and equal in frequency with the input signal but having a nearly constant amplitude, said circuit comprising an amplifier stage for amplifying the input signal and having in its output means for clipping both peaks of the amplified input signal above and below predetermined levels, a band pass filter tuned to the frequency of the input signal and sufficiently selective to reject all of the harmonics thereof for receiving the clipped signal developed by the rectifiers and developing therefrom the output signal from said circuit, said output signal bearing a fixed phase relationship to the input signal despite amplitude variations in the latter and despite any non-symmetrical clipping by the rectifiers, and a pulse generating network excited by said output signal for developing therefrom an output pulse accurately phase locked to the input signal regardless of amplitude variations of said input signal.

References Cited in the file of this patent

UNITED STATES PATENTS

| | | |
|---|---|---|
| 2,552,348 | Shapiro et al. | May 8, 1951 |
| 2,821,629 | Finkel et al. | Jan. 28, 1958 |
| 2,942,197 | Madsen et al. | June 21, 1960 |

FOREIGN PATENTS

| | | |
|---|---|---|
| 167,920 | Australia | July 3, 1956 |